(12) United States Patent
Hazeghi et al.

(10) Patent No.: US 11,923,010 B2
(45) Date of Patent: Mar. 5, 2024

(54) FLASH MEMORY CHIP THAT MODULATES ITS PROGRAM STEP VOLTAGE AS A FUNCTION OF CHIP TEMPERATURE

(71) Applicant: INTEL NDTM US LLC, Santa Clara, CA (US)

(72) Inventors: Arash Hazeghi, San Jose, CA (US); Pranav Kalavade, San Jose, CA (US); Rohit S. Shenoy, Fremont, CA (US); Hsiao-Yu Chang, Sunnyvale, CA (US)

(73) Assignee: INTEL NDTM US LLC, Santa Clara, CA (US)

( * ) Notice: Subject to any disclaimer, the term of this patent is extended or adjusted under 35 U.S.C. 154(b) by 49 days.

(21) Appl. No.: 16/828,843

(22) Filed: Mar. 24, 2020

(65) Prior Publication Data

US 2021/0304820 A1 Sep. 30, 2021

(51) Int. Cl.
*G11C 16/10* (2006.01)
*G06F 3/06* (2006.01)

(52) U.S. Cl.
CPC ............ *G11C 16/10* (2013.01); *G06F 3/0604* (2013.01); *G06F 3/0659* (2013.01); *G06F 3/0679* (2013.01)

(58) Field of Classification Search
CPC ........ G06F 3/06; G06F 3/0604; G06F 3/0659; G06F 3/0679; G11C 16/10; G11C 16/3418; G11C 16/0483; G11C 7/04; G11C 16/30; G11C 16/3404; G01K 3/04; G01K 7/22; G01K 3/005
USPC ........................................................ 711/103
See application file for complete search history.

(56) References Cited

U.S. PATENT DOCUMENTS

| 8,238,185 B2 * | 8/2012 | Lee ........................ G11C 7/04 |
| | | 365/211 |
| 9,099,183 B2 | 8/2015 | Srinivasan et al. |
| 9,330,784 B2 | 5/2016 | Pangal et al. |
| 10,043,574 B2 | 8/2018 | Raghunathan et al. |
| 10,109,361 B1 | 10/2018 | Khakifirooz et al. |
| 10,217,515 B2 | 2/2019 | Goda et al. |
| 10,276,252 B2 | 4/2019 | Madraswala et al. |
| 2013/0024609 A1 * | 1/2013 | Gorobets .............. G06F 3/0611 |
| | | 711/103 |
| 2018/0286476 A1 | 10/2018 | Vali et al. |
| 2019/0043563 A1 | 2/2019 | Khakifirooz et al. |
| 2019/0129648 A1 | 5/2019 | Prabhu et al. |
| 2019/0287627 A1 | 9/2019 | Parat et al. |
| 2020/0202938 A1 * | 6/2020 | Reina ................... G11C 16/349 |
| 2021/0110865 A1 * | 4/2021 | Gopalakrishnan .......................... |
| | | G06F 12/0238 |
| 2021/0132817 A1 * | 5/2021 | Bhat ..................... G06F 11/073 |
| 2022/0189558 A1 * | 6/2022 | Wu ........................ G11C 16/14 |

OTHER PUBLICATIONS

Ye, "A Graphical Journey Into 3D NAND Program Operations", Flash Memory Summit 2018, Santa Clara, CA, 15 pages.

* cited by examiner

*Primary Examiner* — Michael Krofcheck
(74) *Attorney, Agent, or Firm* — Compass IP Law PC

(57) ABSTRACT

A method is described. The method includes performing the following on a flash memory chip: measuring a temperature of the flash memory chip; and, changing a program step size voltage of the flash memory chip because the temperature of the flash memory chip has changed.

20 Claims, 6 Drawing Sheets

FLASH MEMORY CHIP THAT MODULATES ITS PROGRAM STEP VOLTAGE AS A FUNCTION OF CHIP TEMPERATURE

FIELD OF INVENTION

The field of invention pertains generally to the electronic arts, and, more specifically, to a flash memory chip that modulates its program step voltage as a function of chip temperature.

BACKGROUND

With the onset of "big-data", cloud-computing, artificial intelligence and other highly data intensive applications, the performance of non volatile memory is becoming an increasing focus of overall application performance because much of the data that is processed by these applications is ultimately read from and/or written to non volatile memory. As such, systems designers and non volatile memory chip and/or device designers are becoming increasingly focused on improving the performance of their non volatile memory chips and/or devices.

FIGURES

A better understanding of the present invention can be obtained from the following detailed description in conjunction with the following drawings, in which.

DETAILED DESCRIPTION

Figure 1:
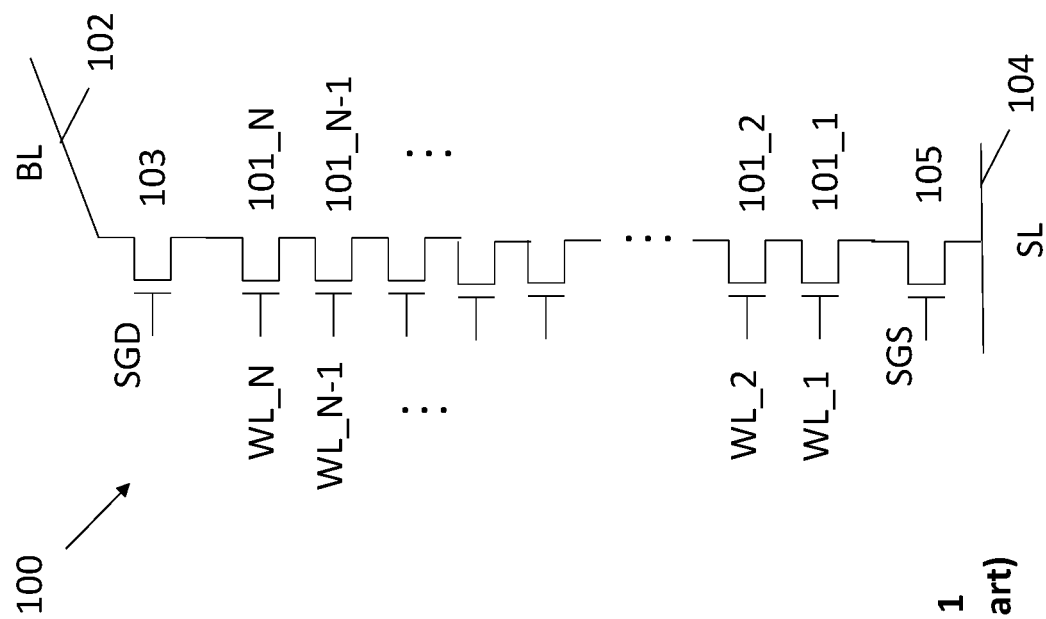
FIG. 1 shows a stack of flash memory cells (prior art)

FIG. 1 shows a stack of flash memory cells 100. As observed in FIG. 1, the stack 100 of flash cells includes N transistors 101_1 through 101_N coupled along a vertical column whose respective gate structures correspond to individual storage elements. The column is accessed on the top side via a bit line (BL) 102 and source-gate-drain (SGD) transistor 103. Bias potentials are applied to the column through a bottom side source line (SL) 104 and a source-gate-source (SGS) transistor 105. Here, bottom is understood to mean closer to the semiconductor chip substrate and top is understood to mean farther away from the semiconductor chip substrate.

As is known in the art, flash memory is written to (technically referred to as "programming") in units of pages. A single block includes an array of flash cell stacks, where, storage cells residing at a same vertical position are tied to a same word line. When reading from or writing to a particular page of information within a block, a particular word line in the block is activated which, in turn, activates the cells of the various stacks that are coupled to that word line. In the case of a read, the respective charges stored in the cells that are coupled to the activated word line influence the potential on their respective columns and bit lines which are then sensed to determine the read information (the cells that are not coupled to the activated word line are isolated from their respective columns).

In the case of a write ("program"), the respective bit lines of the stacks are charged consistently with the data to be programmed which, in turn, influences the potential of their respective columns. The cells that are coupled to the activated word line receive charge from their respective column which effectively programs these cells. The voltage placed on the activated word line is referred to as a "program voltage". The cells that are not coupled to the activated word line do not receive the program voltage and are isolated from their columns during the program operation.

Flash cells are programmed according to a "program-verify" process in which, after cells of a same word line are written to with new data using a particular word line voltage, the cells are then read back to confirm that each of their respective stored charge levels is consistent with the data that was intended to be written into them (verify). Those cells that fail (do not store sufficient charge) are then written to again but with a higher program voltage and again re-verified. Cells that pass are isolated from the re-write. The program-verify process then repeats successive iterations of program-verify operations with increasingly higher program voltage with each iteration until all cells that are tied to the activated word line are deemed to pass.

The program voltage increment across iterations, referred to as the "step-program-voltage" or "step voltage", is a pertinent parameter during the programming process. The larger the step voltage, the faster the overall programming operation. That is, with higher step voltages, the final (highest) applied program voltage needed before all cells are correctly programmed will be reached with fewer iterations and less time. Contrarily, the smaller the step voltage, the final (highest) applied program voltage will be reached with more iterations and more time. With programming time of flash memory devices being a critical performance parameter for such devices, there is a motivation to set the step voltage as large as possible.

Unfortunately, the higher the step voltage, the less precise the programmed charge is across program iterations and across individual cells. Here, commonly, a single flash cell is capable of storing more than two digital states to effect storage of more than one bit per cell. For example, in the case of quad level cell (QLC), each cell is capable of storing sixteen different charge levels which, in turn, corresponds to the storage of four digital bits per cell. In order to successfully store multiple charge levels per cell, the distribution of charge amongst the cells needs to be fairly tight or precise for a same stored digital value. That is, if a number of flash cells are to store a same digital value, their respective stored charges should be nearly identical (there is a narrow charge spread amongst them). If it were it otherwise, it would be difficult if not impossible to program a particular one of multiple values into many different storage cells and then successfully read the correct value back from each of the cells. The challenge of keeping charge distributions sufficiently narrow is apt to become even more difficult to achieve for future flash generations that store even more states per cell (e.g., penta level cell (PLC) that stores five bits or thirty two discrete states per cell).

Increasing step size, however, makes it more difficult to ensure charge levels across all cells for same stored digital states are sufficiently precise with correspondingly narrow charge spreads. Therefore there exists an upper bound as to how large the step size can be set.

Adding to the complexity is the dependence of programming and read operations on temperature. The memory is read by measuring the amount of charge in each cell. This is usually done by applying the read level bias on the target word line (WL) and measuring the current that passes through the string of cells. The amount of current that flows through the string of cells varies with temperature. As such, a cell's measured charge level can also change with temperature.

As such, errors can result if a cell is programmed at a first temperature and then read from at a second, different temperature. Here, during the verification sequence(s) of the program operation at a first temperature, the sensing circuitry will measure a first amount of charge to be a correct level before deeming the programmed cell a "pass". If the temperature changes to a second, different temperature during a subsequent read of the cell at some later time, the sensing circuitry will sense a different amount of charge from the cell (even though the actual charge amount has not changed).

In extreme cases, the determined charge levels between final program verification and nominal read can be such that the charge level that is detected during the read corresponds to a different digital stored state than what the same sensing circuitry believed the state to be at final verification. The reading of a different digital stored state than what was programmed essentially corresponds to a read error.

As such, conventional memory chips are designed to program the different digital state levels with extremely narrow charge distributions which, in effect, builds substantial margin between states so as to accommodate a worst case scenario, where, e.g., a cell is programmed at one extreme temperature (e.g., 70° C.) but will be read at the other extreme temperature (e.g., 0° C.).

Figure 2:
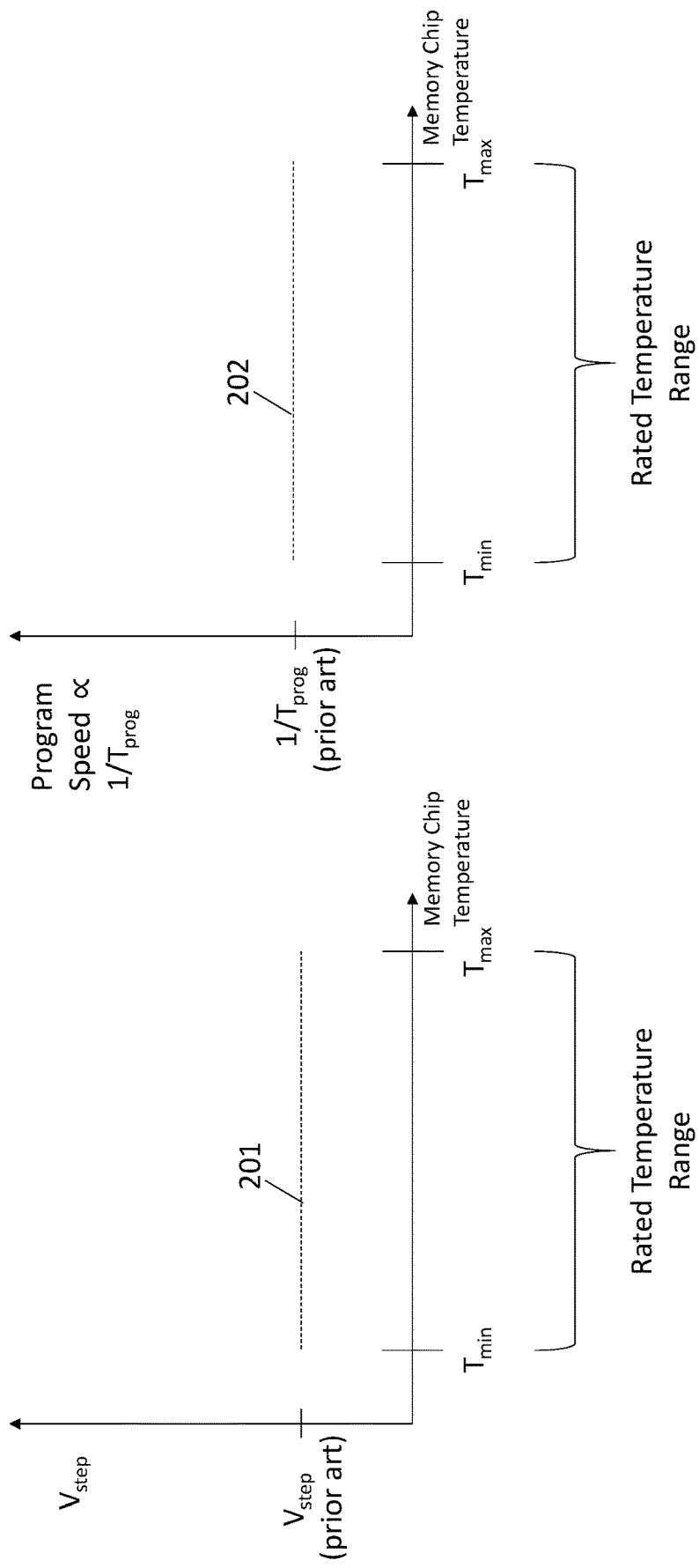
FIG. 2 shows program step size voltage as a function of chip temperature (prior art)

A resulting inefficiency, however, is that very small program step sizes must be used in order to program the digital state levels with extremely narrow charge distributions. As discussed above, the very small program step sizes translates into longer program times (the amount of time consumed programming a block of cells) because more program-verify iterations need to be executed in order to fully program all cells (e.g., in the page being programmed). As such, as observed in FIG. 2, a prior art flash memory device is characterized as having a fixed, smaller step size 201 and a correspondingly fixed, slower program time 202 over its rated temperature range.

Figure 3:
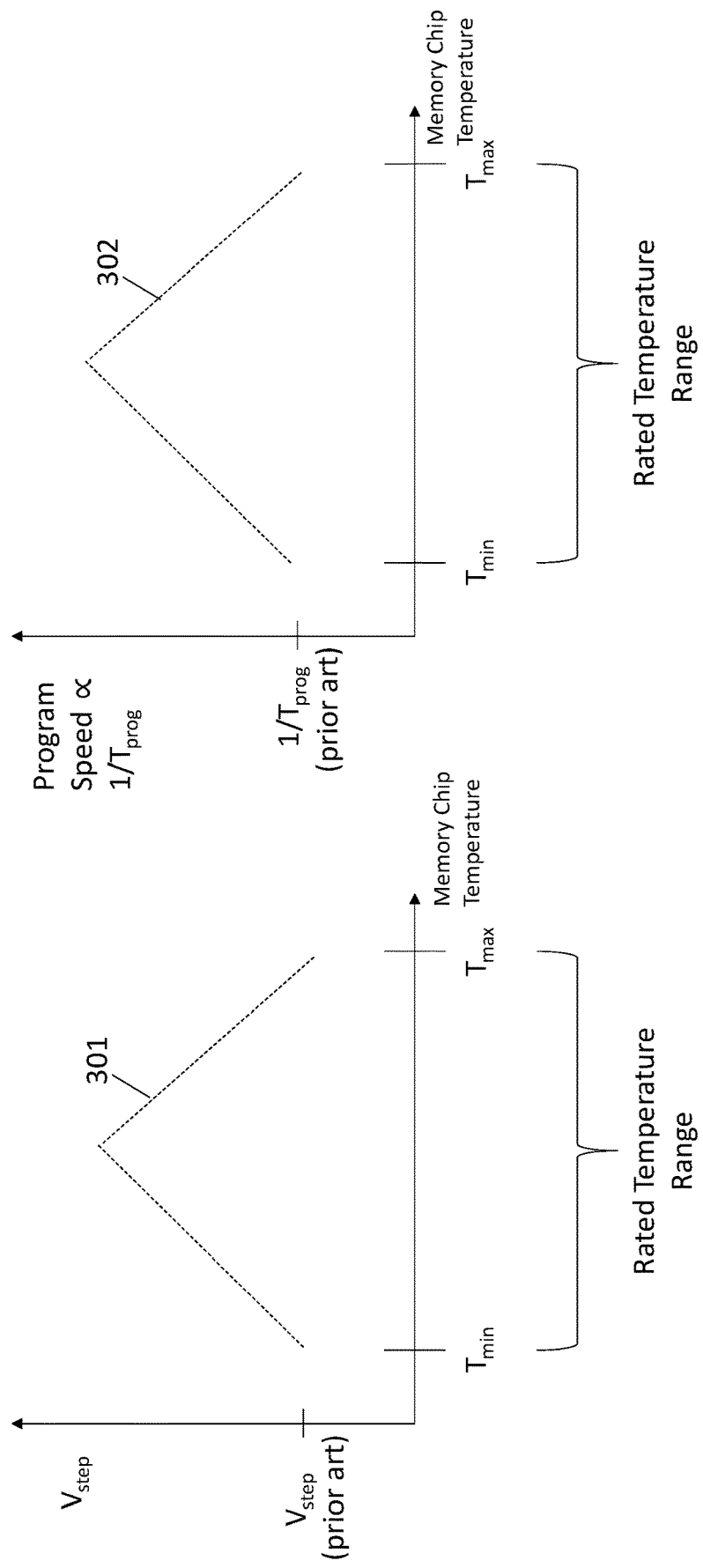
FIG. 3 shows an improved approach that changes program step size voltage as a function of chip temperature.

A solution is depicted in FIG. 3. According to the approach of FIG. 3, the programming step size 301 is a function of the flash memory chip's temperature (a conventional flash memory chip typically includes a thermistor or other integrated device that generates a signal that correlates to the memory chip's temperature). Here, a memory chip will typically operate around 30° C., which is often near the middle of its rated temperature range. That is, for example, flash memory chips typically have a temperature range akin to 0° C. to 70° C., and, the operating temperature of 30° C. is near the midpoint of the range (which is 35° C.).

As can be seen in FIG. 3, program step-size voltage is permitted to climb as the operating temperature of the memory chip approaches the mid-point of its rated operating temperature range (either in a warming direction or a cooling direction). Here, with knowledge that the actual temperature of the memory device is closer to the mid-point of its rated temperature range, it can be confirmed that the worst case temperature difference between program temperature and subsequent read temperature will not happen.

That is, for instance, if the memory chip happens to be operating exactly at the midpoint of its rated temperature range (e.g., the chip's temperature is 35° C. and the rated temperature range is 0° C. to 70° C.), only "one half" of the worst case scenario is possible (if a program operation occurs at 35° C., a worst case read at 0° C. or 70° C. corresponds to a program/read temperature difference of 35° C. and not 70° C.).

If only one-half of a worst case scenario is at stake, the charge distributions of the stored digital states need not be as narrow, which, in turn, permits increased program step-size voltage 301 and correspondingly faster overall program operations 302 (blocks are fully programmed in less time). As such, a memory chip that is operating at a typical operating temperature (e.g., of around 30° C.), can implement comparably faster program operations because a larger program step-size voltage is being used. That is, the memory device is smart enough to program at larger step sizes because it knows the worst case program/read temperature difference scenario is not possible.

If, e.g., under an atypical situation in which the temperature of the memory chip is closer to one of its rated temperature extremes (e.g., 0° C. or 70° C.), the device applies a much smaller step-size (e.g., as was used in a prior art device) that protects against a worst case program/read temperature difference. That is, for instance, if the temperature of the memory chip is at 70° C., a smaller more traditional step size is used so that, by chance if the temperature of the memory device were to drop to 0° C. and a read were performed of a block that was written to at 70° C., no read bit errors would occur.

In an alternative implementation the memory can write the data to a cache that is less prone to temperature effects as the chip temperature approaches its outer limits, such as single level cell (SLC) cache (an SLC cache consists of binary flash cells that only store two states and can therefore be programmed in less time than flash cells that can store more than two states). When the temperature is closer to a normal operating temperature the system can move the data from the SLC cache to blocks whose cells that store more than two states (e.g., quad level cell (QLC) blocks. Said another way, data is written to less dense cells as the chip's temperature migrates towards the outer limits of its temperature range, and, is written to higher density cells as the chip's temperature migrates toward the middle of its rated temperature range.

Thus, the improved memory chip is able to modulate its program step size as a function of the program/read temperature difference, with the consequence that a program operation performed somewhere in the vicinity of the midpoint of its rated temperature range can use larger program step sizes because the worst case temperature of a subsequent read is approximately one half the rated temperature range rather than the entire rated range. Will the realization that many flash memory chips typically operate in the vicinity of the midpoint of their temperature range, the temperature related modulation of program step size can result in noticeably improved/faster program operations.

Note that the "triangular" step size adjustments observed in FIG. 3 are only exemplary. Although some embodiments may exhibit triangular step size adjustments, other embodiments may depart therefrom. For example, some embodiments may roll-over towards the middle of the memory chip temperature range such that there is some kind of plateau rather than a peak in the vicinity of the middle of the range.

Figure 4A:
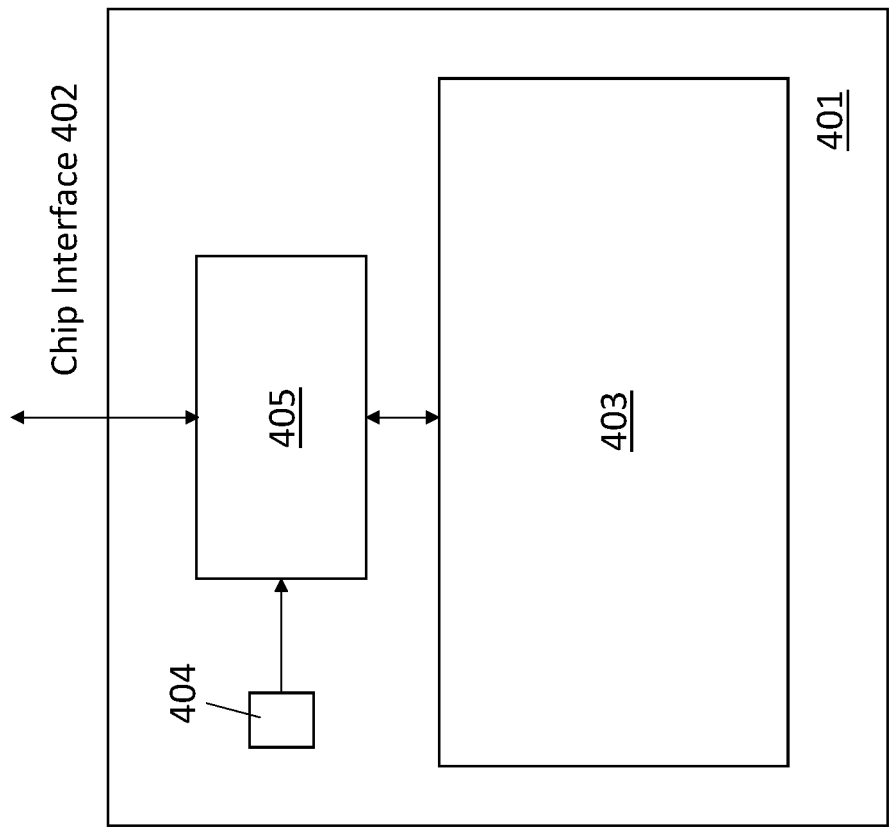
FIG. 4a shows a flash memory chip.

FIG. 4*a* shows a flash memory chip 401 that can modulate its program step size based on its internal temperature as discussed at length above. As observed in FIG. 4*a*, the flash memory chip 401 includes a chip interface 402 through which commands (e.g., read commands, program commands, erase commands, etc.) are received from some other entity (such as a solid state drive controller or memory module controller). The memory chip 401 also includes a memory array 403.

The memory array 403 includes an array of stacks of memory cells (such as an array of stacks designed like the memory cell stack depicted in FIG. 1). The memory chip 401 also includes an internal temperature measurement device 404 (e.g., thermistor) that is coupled to a controller 405. The controller 405 applies the physical signals to the memory array 403 to perform program and read operations on the cells of the array, including program voltages and their corresponding step sizes. Here, the internal temperature measuring device 404 is coupled to the controller 405. The controller 405 modulates the program step size voltage in view of the current chip temperature at the time of programming as described at length above. The controller can be implemented with logic circuitry such as hard wired logic circuitry and/or logic circuitry designed to perform some form of program code (e.g., firmware).

Figure 4B:
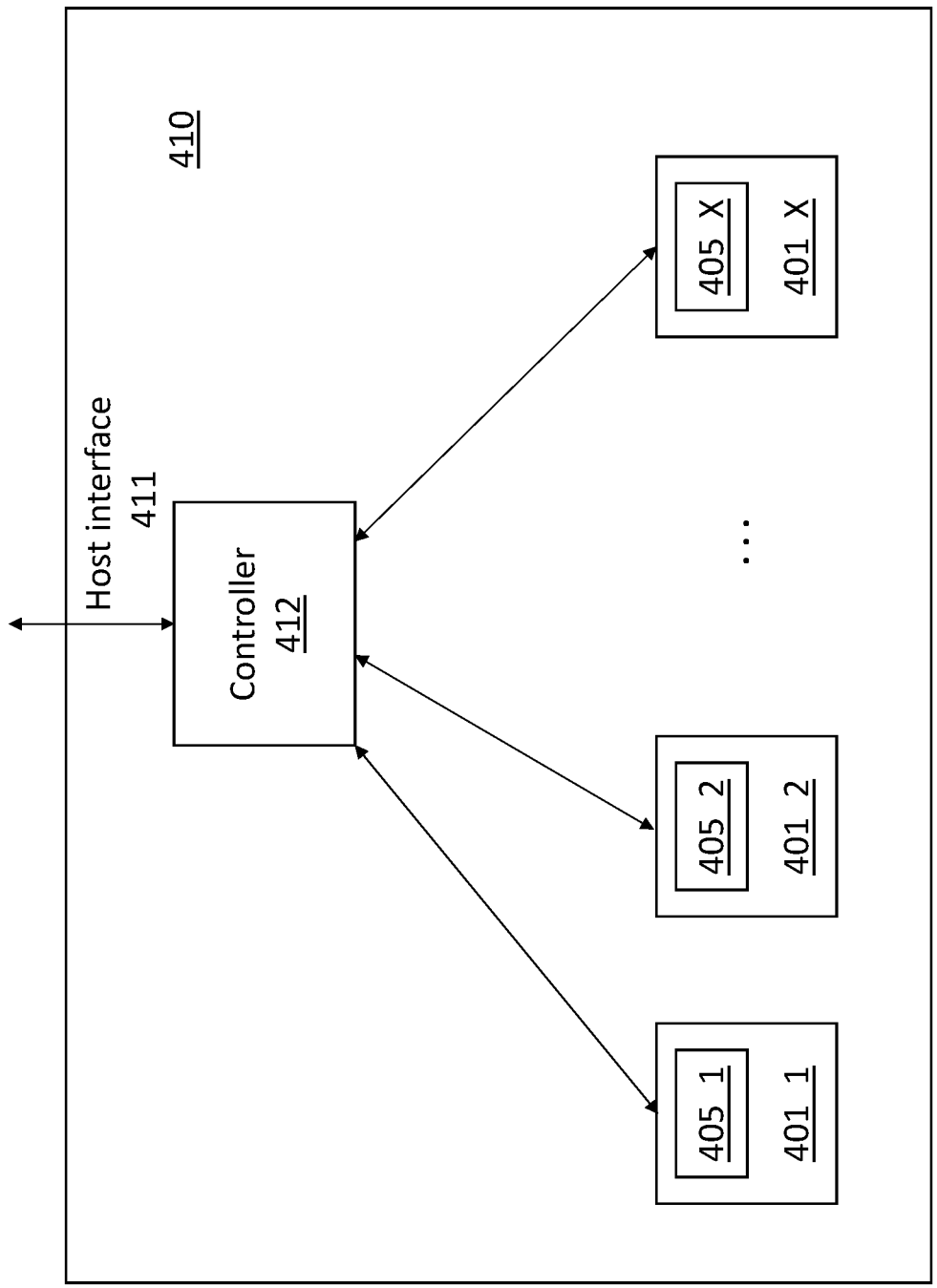
FIG. 4b shows a memory device.

FIG. 4b shows a memory device 410 such as a solid state drive, stacked memory module or dual-in-line memory module. As depicted in FIG. 4b, the memory device 410 includes a host interface 411 through which commands (e.g., read commands, write commands) are received from a host system such as a larger computer system. The memory device also includes a controller 412 and X flash memory chips 401_1 through 401_X with respective controllers 405_1 through 405_X. Each controller 405 modulates its respective chip's controller based on the chip's temperature as described at length above.

Figure 5:
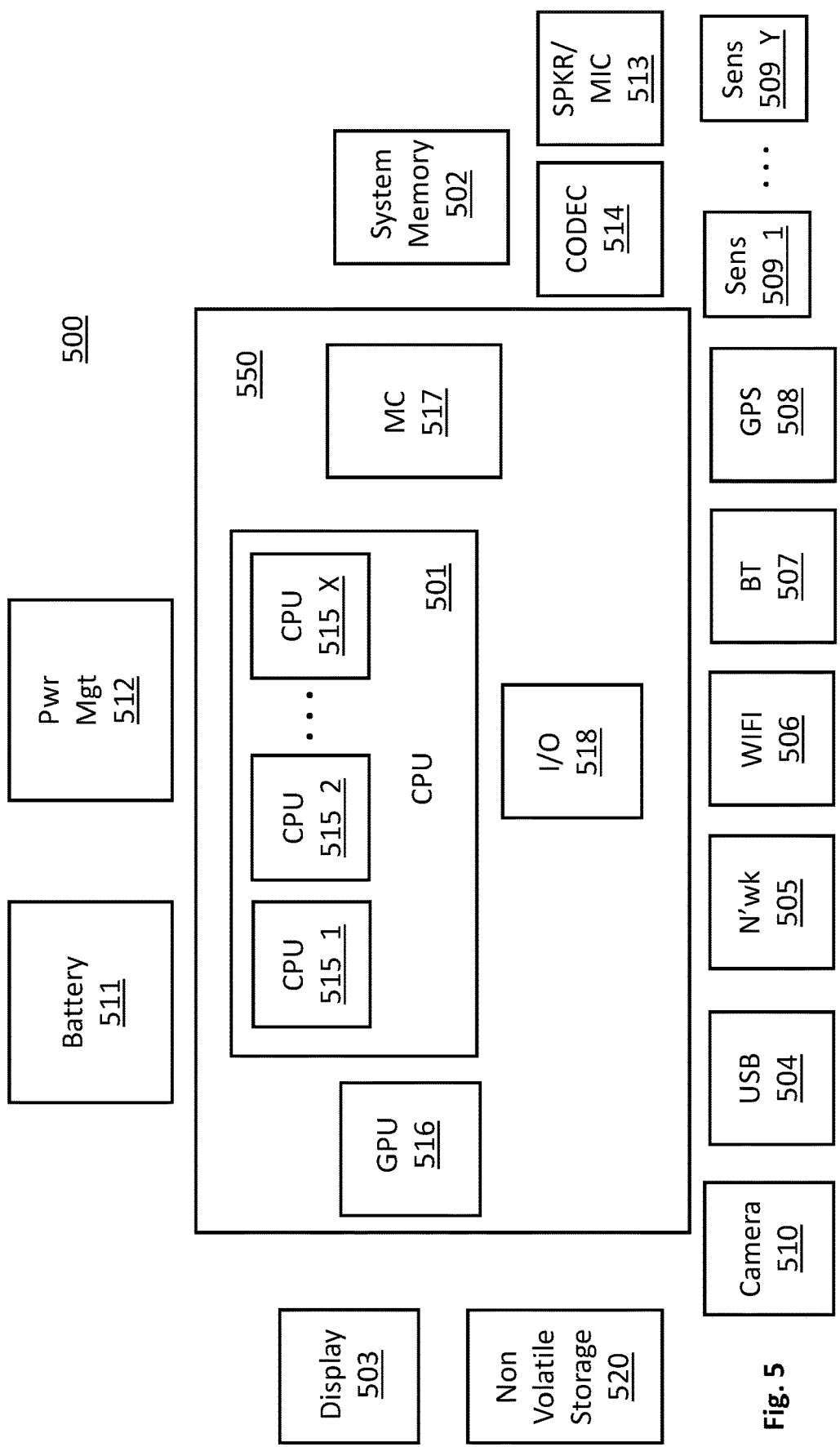
FIG. 5 shows a computing system.

FIG. 5 provides an exemplary depiction of a computing system 500 (e.g., a smartphone, a tablet computer, a laptop computer, a desktop computer, a server computer, etc.). As observed in FIG. 5, the computing system 500 may include a central processing unit 501 (which may include, e.g., a plurality of general-purpose processing cores 515_1 through 515_X) and a system memory controller 517 (also referred to as a main memory controller) disposed on a multi-core processor or applications processor, system memory 502 (also referred to as main memory), a display 503 (e.g., touchscreen, flat-panel), a local wired point-to-point link (e.g., USB) interface 504, various network I/O functions 505 (such as an Ethernet interface and/or cellular modem subsystem), a wireless local area network (e.g., WiFi) interface 506, a wireless point-to-point link (e.g., Bluetooth) interface 507 and a Global Positioning System (GPS) interface 508, various sensors 509_1 through 509_Y, one or more cameras 510, a battery 511, a power management control unit 512, a speaker and microphone 513 and an audio coder/decoder 514.

An application processor or multi-core processor 550 may include one or more general-purpose processing cores 515 within its CPU 501, one or more graphical processing units 516, a main/system memory controller 517 and an I/O control function 518 (also referred to as a peripheral control hub). The general-purpose processing cores 515 typically execute the system and application software of the computing system. The graphics processing unit 516 typically executes graphics intensive functions to, e.g., generate graphics information that is presented on the display 503. The memory control function 517 interfaces with the system memory 502 to write/read data to/from system memory 502.

Any of the system memory 502 and/or non volatile mass storage 520 can be composed with a three dimensional non volatile random access memory composed, e.g., of an emerging non volatile storage cell technology. Examples include Optane memory from Intel Corporation, QuantX from Micron Corporation, and/or other types of resistive non-volatile memory cells integrated amongst the interconnect wiring of a semiconductor chip (e.g., resistive random access memory (ReRAM), ferroelectric random access memory (FeRAM), spin transfer torque random access memory (STT-RAM), etc.). Mass storage 520 at least can also be composed of flash memory (e.g., NAND flash).

The mass storage 520, or conceivably even system memory 502 if composed of non volatile (e.g., flash) memory, could be implemented with non volatile memory chips that modulate program step size voltage based on chip temperature as described at length above.

Each of the touchscreen display 503, the communication interfaces 504-507, the GPS interface 508, the sensors 509, the camera(s) 510, and the speaker/microphone codec 513, 514 all can be viewed as various forms of I/O (input and/or output) relative to the overall computing system including, where appropriate, an integrated peripheral device as well (e.g., the one or more cameras 510). Depending on implementation, various ones of these I/O components may be integrated on the applications processor/multi-core processor 550 or may be located off the die or outside the package of the applications processor/multi-core processor 550. The power management control unit 512 generally controls the power consumption of the system 500.

Embodiments of the invention may include various processes as set forth above. The processes may be embodied in machine-executable instructions. The instructions can be used to cause a general-purpose or special-purpose processor to perform certain processes. Alternatively, these processes may be performed by specific/custom hardware components that contain hardwired logic circuitry or programmable logic circuitry (e.g., FPGA, PLD) for performing the processes, or by any combination of programmed computer components and custom hardware components.

Elements of the present invention may also be provided as a machine-readable medium for storing the machine-executable instructions. The machine-readable medium may include, but is not limited to, floppy diskettes, optical disks, CD-ROMs, and magneto-optical disks, FLASH memory, ROMs, RAMs, EPROMs, EEPROMs, magnetic or optical cards, propagation media or other type of media/machine-readable medium suitable for storing electronic instructions. For example, the present invention may be downloaded as a computer program which may be transferred from a remote computer (e.g., a server) to a requesting computer (e.g., a client) by way of data signals embodied in a carrier wave or other propagation medium via a communication link (e.g., a modem or network connection).

The following has been described above.

An apparatus having a flash memory chip having i), ii), iii) and iv) below: i) a chip interface to receive commands; ii) an array of stacked storage cells; iii) a temperature sensing device; and, iv) a controller coupled to the chip interface, the array of stacked storage cells and the temperature sensing device, wherein the controller is to modulate a program step size voltage applied to the memory array based on the chip's temperature as measured by the temperature sensing device.

The controller is to increase the program step size voltage as the chip's temperature approaches a midpoint of the chip's rated temperature range. The increase of the program step size voltage is to happen in both chip warming and chip cooling directions. An increase in the program step size voltage results in wider charge distribution in the storage cells. The controller is to set the program step size voltage to a minimum at the chip's maximum temperature of the chip's rated temperature range or the minimum temperature of the chip's rated temperature range. The minimum program step size voltage results in narrowest charge distributions within the storage cells. The controller is to decrease the program step size voltage as the chip's temperature moves away from a midpoint of the chip's rated temperature range.

A computing system is described having a plurality of processing cores, a system memory, a system memory controller coupled to either of the system memory, a peripheral control hub, and, a memory device coupled to the system memory controller or the peripheral control hub. The memory device has a controller as described just above.

A method is also described. The method includes performing the following on a flash memory chip: measuring a temperature of the flash memory chip; and, changing a program step size voltage of the memory chip because the temperature of the memory chip has changed.

The method is performed wherein the temperature's change approaches a midpoint of the flash memory chip's rated temperature range. The temperature's change can be a warming change. The temperature's change can be a cooling change. The program step size voltage's change can be an increase in program step size voltage. The increase in program step size voltage lessens a program time for a block of the flash memory chip's storage cells.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. An apparatus, comprising:
a flash memory chip comprising i), ii), iii) and iv) below:
  i) a chip interface to receive commands;
  ii) a first array of stacked storage cells;
  iii) a temperature sensing device; and,
  iv) a controller coupled to the chip interface, the first array of stacked storage cells and the temperature sensing device, wherein the controller is to modulate a program step size voltage applied to the first array of stacked storage cells based on a temperature of the flash memory chip as measured by the temperature sensing device, wherein the controller is to decrease the program step size voltage as the temperature of the flash memory chip moves away from a midpoint temperature of a rated temperature range of the flash memory chip and toward a maximum temperature of the rated temperature range of the flash memory chip and is to decrease the program step size voltage as the temperature of the flash memory chip moves away from the midpoint temperature of the rated temperature range of the flash memory chip and toward a minimum temperature of the rated temperature range of the flash memory chip, such that, a different program step size voltage exists for each different temperature within the rated temperature range of the flash memory chip from the midpoint temperature of the rated temperature range of the flash memory chip to the minimum temperature of the rated temperature range of the flash memory chip.

2. The apparatus of claim 1 wherein the controller is to increase the program step size voltage as the temperature of the flash memory chip approaches the midpoint temperature of the rated temperature range of the flash memory chip.

3. The apparatus of claim 2 wherein the increase of the program step size voltage is to happen in both warming and cooling directions of the flash memory chip.

4. The apparatus of claim 2 wherein an increase in the program step size voltage results in wider charge distribution in the storage cells.

5. The apparatus of claim 1 wherein the controller is to set the program step size voltage to a minimum upon at least one of the following conditions: 1) the maximum temperature of the rated temperature range of the flash memory chip; 2) a minimum temperature of the rated temperature range of the flash memory chip.

6. The apparatus of claim 5 wherein the minimum program step size voltage results in narrowest charge distributions within the first array of stacked storage cells.

7. The apparatus of claim 1 wherein change in program step size exhibits an inflection point at the midpoint temperature of the rated temperature range of the flash memory chip.

8. A computing system, comprising:
a plurality of processing cores;
a system memory;
a system memory controller coupled to the system memory;
a peripheral control hub; and,
a memory device coupled to the system memory controller or the peripheral control hub, the memory device comprising a flash memory chip, the flash memory chip comprising i), ii), iii), and iv) below:
  i) a chip interface to receive commands;
  ii) a first array of stacked storage cells;
  iii) a temperature sensing device; and,
  iv) a controller coupled to the chip interface, the first array of stacked storage cells and the temperature sensing device, wherein the controller is to modulate a program step size voltage applied to the array of stacked storage cells based on a temperature of the flash memory chip as measured by the temperature sensing device, wherein the controller is to decrease the program step size voltage as the temperature of the flash memory chip moves away from a midpoint temperature of a rated temperature range of the flash memory chip and toward a maximum temperature of the rated temperature range of the flash memory chip and is to decrease the program step size voltage as the temperature of the flash memory chip moves away from the midpoint temperature of the rated temperature range of the flash memory chip and toward a minimum temperature of the rated temperature range of the flash memory chip, such that, a different program step size voltage exists for each different temperature within the rated temperature range of the flash memory chip from the midpoint temperature of the rated temperature range of the flash memory chip to the minimum temperature of the rated temperature range of the flash memory chip.

9. The computing system of claim 8 wherein the controller is to increase the program step size voltage as the temperature of the flash memory chip approaches the midpoint temperature of the rated temperature range of the flash memory chip.

10. The computing system of claim 9 wherein the increase of the program step size voltage is to happen in both warming and cooling directions of the flash memory chip.

11. The computing system of claim 9 wherein an increase in the program step size voltage results in wider charge distribution in the storage cells.

12. The computing system of claim 8 wherein the controller is to set the program step size voltage to a minimum at upon at least one of the following conditions: 1) the maximum temperature of the rated temperature range of the flash memory chip; 2) a minimum temperature of the rated temperature range of the flash memory chip.

13. The computing system of claim 12 wherein the minimum program step size voltage results in narrowest charge distributions within the first array of stacked storage cells.

14. The apparatus of claim 8 wherein change in program step size exhibits an inflection point at the midpoint temperature of the rated temperature range of the flash memory chip.

15. A method, comprising:
performing the following on a flash memory chip:
measuring a temperature of the flash memory chip;
changing a program step size voltage of a first array of stacked storage cells of the flash memory chip because the temperature of the flash memory chip has changed including decreasing the program step size voltage as the temperature of the flash memory chip moves away from a midpoint temperature of a rated temperature range of the flash memory chip and toward a maximum temperature of the rated temperature range of the flash memory chip; and,
changing the program step size voltage of the first array of stacked storage cells of the flash memory chip because the temperature of the flash memory chip has again changed including decreasing the program step size voltage as the temperature of the flash memory chip moves away from a midpoint temperature of a rated temperature range of the flash memory chip and toward a minimum temperature of the rated temperature range of the flash memory chip, wherein, a different program step size voltage exists for each different temperature within the rated temperature range of the flash memory chip from the midpoint temperature of the rated temperature range of the flash memory chip to the minimum temperature of the rated temperature range of the flash memory chip.

16. The method of claim 15 wherein the method further comprises changing the program step size because the temperature is approaching the midpoint voltage of the rated temperature range of the flash memory chip.

17. The method of claim 16 wherein the temperature is warming.

18. The method of claim 17 wherein the temperature is cooling.

19. The method of claim 16 wherein the program step size voltage's change is an increase in program step size voltage.

20. The method of claim 19 wherein the increase in program step size voltage lessens a program time for a block of the first array of stacked storage cells.

* * * * *